United States Patent
Mohamadi

(10) Patent No.: US 7,830,989 B2
(45) Date of Patent: Nov. 9, 2010

(54) ULTRA WIDEBAND IMPULSE RADAR

(76) Inventor: Farrokh Mohamadi, 8 Halley, Irvine, CA (US) 92603-3797

( * ) Notice: Subject to any disclaimer, the term of this patent is extended or adjusted under 35 U.S.C. 154(b) by 1019 days.

(21) Appl. No.: 11/555,210

(22) Filed: Oct. 31, 2006

(65) Prior Publication Data

US 2008/0252546 A1 Oct. 16, 2008

Related U.S. Application Data

(63) Continuation-in-part of application No. 11/454,915, filed on Jun. 16, 2006, now Pat. No. 7,683,852, which is a continuation-in-part of application No. 11/141,283, filed on May 31, 2005, now Pat. No. 7,312,763.

(51) Int. Cl.
*H04L 27/22* (2006.01)

(52) U.S. Cl. ............... 375/343; 343/850; 343/852; 343/853; 343/858; 343/859; 343/860; 343/861; 370/213; 375/239; 375/340

(58) Field of Classification Search ............... 375/130, 375/295, 239, 340, 343; 343/853, 850, 852, 343/858–861; 342/368, 145, 189; 333/128; 341/144; 370/338, 213

See application file for complete search history.

(56) References Cited

U.S. PATENT DOCUMENTS

| | | | | |
|---|---|---|---|---|
| 7,283,595 | B2 * | 10/2007 | Jun | 375/295 |
| 7,312,763 | B2 * | 12/2007 | Mohamadi | 343/853 |
| 7,683,852 | B2 * | 3/2010 | Mohamadi | 343/853 |
| 2003/0161411 | A1 * | 8/2003 | McCorkle et al. | 375/295 |
| 2005/0043004 | A1 * | 2/2005 | Kaizaki et al. | 455/326 |
| 2005/0075080 | A1 * | 4/2005 | Zhang | 455/73 |
| 2006/0077102 | A1 * | 4/2006 | Mohamadi | 343/700 MS |
| 2007/0273458 | A1 * | 11/2007 | Pepper et al. | 333/167 |

(Continued)

OTHER PUBLICATIONS

R.J. Fontana, Recent System Applications of Short-Pulse Ultra-Wideband (UWB) Technology, IEEE Microwave Theory and Tech, Sep. 2004, vol. 52, No. 9.

(Continued)

*Primary Examiner*—Mohammad H Ghayour
*Assistant Examiner*—Eboni Giles
(74) *Attorney, Agent, or Firm*—Haynes & Boone, LLP.

(57) ABSTRACT

In one embodiment, a wafer scale radar antenna module (WSAM) is provided that includes: a substrate; a plurality of antennas adjacent the substrate; an RF feed network adjacent the substrate, the RF feed network coupling to a distributed plurality of amplifiers integrated with the substrate, wherein the RF feed network and the distributed plurality of amplifiers are configured to form a resonant network such that if a timing signal is injected into an input port of the RF feed network, the resonant network oscillates to provide a globally synchronized RF signal to a plurality of integrated antenna circuits, wherein each integrated antenna circuits includes a corresponding subset of antennas from the plurality of antennas, and wherein each integrated antenna circuit includes a pulse shaping circuit having a plurality of selectable delay paths, each pulse shaping circuit being configured to rectify and level shift a version of the globally synchronized signal through selected ones of the selectable delay paths to provide an pulse train output signal; and a controller operable to control each integrated antenna circuit such that only selected pulses from the pulse train output signal are transmitted through the integrated antenna circuit's subset of antennas to form transmitted pulses.

18 Claims, 15 Drawing Sheets

U.S. PATENT DOCUMENTS

| | | | |
|---|---|---|---|
| 2008/0056337 A1* | 3/2008 | Tal et al. | 375/219 |
| 2008/0130685 A1* | 6/2008 | Rogerson et al. | 370/478 |
| 2008/0252546 A1* | 10/2008 | Mohamadi | 343/853 |
| 2008/0267324 A1* | 10/2008 | Mimura et al. | 375/343 |

OTHER PUBLICATIONS

I. Guvenc et al., TOA Estimation for IR-UWB Systems With Different Transceiver Types, IEEE Transactions on Microwave Theory and Techniques, Apr. 2006, vol. 54, No. 4.

Z. Yun and M.F. Iskander, UWB Pulse Propagation Through Complex Walls in Indoor Wireless Communications Environments, International Conference on Wireless Networks, 2005.

V. Venkatasubramanian and H. Leung, A Novel Chaos-Based High-Resolution Imaging Technique and Its Application to Through-the-Wall Imaging, IEEE Signal Processing Letters, 2005.

I.P. Theron, et al., Wide-Band Noise Radar in the VHF/UHF Band, IEEE Transactions on Antennas and Propagation, Jun. 1999, vol. 47 No. 6.

S.R.J Axelson, Noise Radar for Range/Doppler Processing and Digital Beamforming Using Low-Bit ADC, IEEE Transactions on Geoscience and Remote Sensing, Dec. 2003.

D.S. Garmatyuk and R.M. Narayanan, Ultra-Wideband Continuous-Wave Random Noise Arc-SAR, IEEE Transactions on Geoscience and Remote Sensing, Dec. 2002.

J. Han and C. Nguyen, A New Ultra-Wideband, Ultra-short Monocycle Pulse Generator with Reduced Ringing, IEEE Microwave and Wireless Components Letters, Jun. 2002, pp. 206-208.

H. Zirath et al., Development of 60-GHz Front-end Circuit for a High-Data-Rate Communication System, IEEE Journal of Solid-State Circuits, Oct. 2004, vol. 39 No. 10.

E. Afshari, et al., Electrical Funnel: A Broadband Signal Combining Method, IEEE International Solid-State Circuits Conference, 2006, pp. 206-207.

U.R. Pfeiffer et al., A 77GHz SiGe Power Amplifier for Potential Applications in Automotive Radar Systems, IEEE RFIC Symposium, Jun. 2004, pp. 91-94.

B. Gaucher et al., MM-Wave Tranceivers Using SiGe HBT Technology, Topical Meeting on Silicon Monolithic Integrated Circuits in RF Systems, 2004.

T. Zwick, et al., Wideband Channel Sounder With Measurements and Model for the 60 GHz Indoor Radio Channel, IEEE Transactions on Vehicular Technology, Jul. 2005.

B.A. Floyd et al., SiGe Bipolar Tranceiver Circuits Operating at 60 GHz, IEEE Journal of Solid-State Circuits, Jan. 2005, vol. 40 No. 1.

A.A.M. Saleh and R.A. Valenzuela, A Statistical Model for Indoor Multipath Propagation, IEEE J. Select Areas Communication, Feb. 1987, pp. 128-137, vol. 5 No. 3.

E. Skafidas and R.J. Evans, Antenna Effects on the Capacity of Mimo Communications Systems in Rayleigh Channels, IEEE, 2004, pp. 617-621.

F. Mohamadi, A Proposed Completely Electronically Controlled Beamforming Technology for Coverage Enhancement, IEEE P802.15 Working Group, Mar. 2005, Atlanta, GA.

* cited by examiner

ULTRA WIDEBAND IMPULSE RADAR

RELATED APPLICATIONS

This application is a continuation-in-part of U.S. application Ser. No. 11/454,915, filed Jun. 16, 2006 now U.S. Pat. No. 7,683,852, which in turn is a continuation-in-part of U.S. application Ser. No. 11/141,283, filed May 31, 2005 now U.S. Pat. No. 7,312,763.

TECHNICAL FIELD

The disclosure relates generally to radar and more particularly to ultra wideband (UWB) impulse radar.

BACKGROUND

Ultra wideband (UWB) impulse radar systems utilize pulse widths on the order of hundreds of picoseconds (trillionth of a second). Because such short pulses necessarily have very few cycles or even a single cycle of RF signal (such as a Gaussian monopulse), UWB radars may be considered to operate in the time domain as opposed to conventional frequency domain processing of received pulses. This time domain operation enables UWB radars to enjoy very fine range resolutions such as on the order of a fraction of a few feet or less. In addition, UWB radars have high power efficiency because of their low transmit duty cycle. Moreover, UWB radars provide users with a very low probability of detection because their transmitted pulses occupy a relatively large bandwidth and thus have low power spectral density.

Given their advantages, a great deal of research and development has been dedicated to the subject of UWB radars. For example, see-through-wall UWB radars have been developed that enable users to detect targets such as people on the other side of walls and floors. Such UWB radars are naturally of great interest to military and law enforcement agencies. However, their current range resolution is rather coarse. Moreover, these UWB radars generally do not have beamforming capabilities such that a user must physically scan by moving the UWB radar.

Accordingly, there is a need in the art for UWB radars with enhanced range resolution and beamforming capabilities.

SUMMARY

In accordance with an embodiment of the invention, a wafer scale radar antenna module (WSAM) is provided that includes: a substrate; a plurality of antennas adjacent the substrate; an RF feed network adjacent the substrate, the RF feed network coupling to a distributed plurality of amplifiers integrated with the substrate, wherein the RF feed network and the distributed plurality of amplifiers are configured to form a resonant network such that if a timing signal is injected into an input port of the RF feed network, the resonant network oscillates to provide a globally synchronized RF signal to a plurality of integrated antenna circuits, wherein each integrated antenna circuits includes a corresponding subset of antennas from the plurality of antennas, and wherein each integrated antenna circuit includes a pulse shaping circuit having a plurality of selectable delay paths, each pulse shaping circuit being configured to rectify and level shift a version of the globally synchronized signal through selected ones of the selectable delay paths to provide an pulse train output signal; and a controller operable to control each integrated antenna circuit such that only selected pulses from the pulse train output signal are transmitted through the integrated antenna circuit's subset of antennas to form transmitted pulses.

In accordance with another embodiment of the invention, a method is provided comprising the acts of: driving a resonant network of distributed oscillators to produce an globally synchronized output signal having harmonics; processing a selected one of the harmonics to produce a train of pulses; and transmitting selected ones of the pulses in the train of pulses.

In accordance with another embodiment of the invention, a wafer scale radar antenna module (WSAM) is provided that includes: a substrate, a plurality of antennas adjacent a first side of the substrate; an RF feed network adjacent a second side of the substrate, the RF feed network coupling to a distributed plurality of amplifiers integrated with the substrate, wherein the RF feed network and the distributed plurality of amplifiers are configured to form a resonant network such that if a timing signal is injected into an input port of the RF feed network, the resonant network oscillates to provide a globally synchronized RF signal to a plurality of integrated antenna circuits, wherein each integrated antenna circuits includes a corresponding subset of antennas from the plurality of antennas, and wherein each integrated antenna circuit includes a pulse shaping circuit having a plurality of selectable delay paths, each pulse shaping circuit being configured to rectify and level shift a version of the globally synchronized signal through selected ones of the selectable delay paths to provide an pulse train output signal; a controller operable to control each integrated antenna circuit such that only selected pulses from the pulse train output signal are transmitted through the integrated antenna circuit's subset of antennas to form transmitted pulses; and a plurality of receivers corresponding to the plurality of integrated antenna circuits, each receiver being integrated into the substrate and having a plurality of channels, each channel including a delay line configured to delay a received signal from the corresponding integrated antenna circuit, a correlator configured to multiply the delayed received reflected pulses with selected pulses from the pulse train output to form a product output signal, and an integrator operable to add the product output signal over time to form a sum signal.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
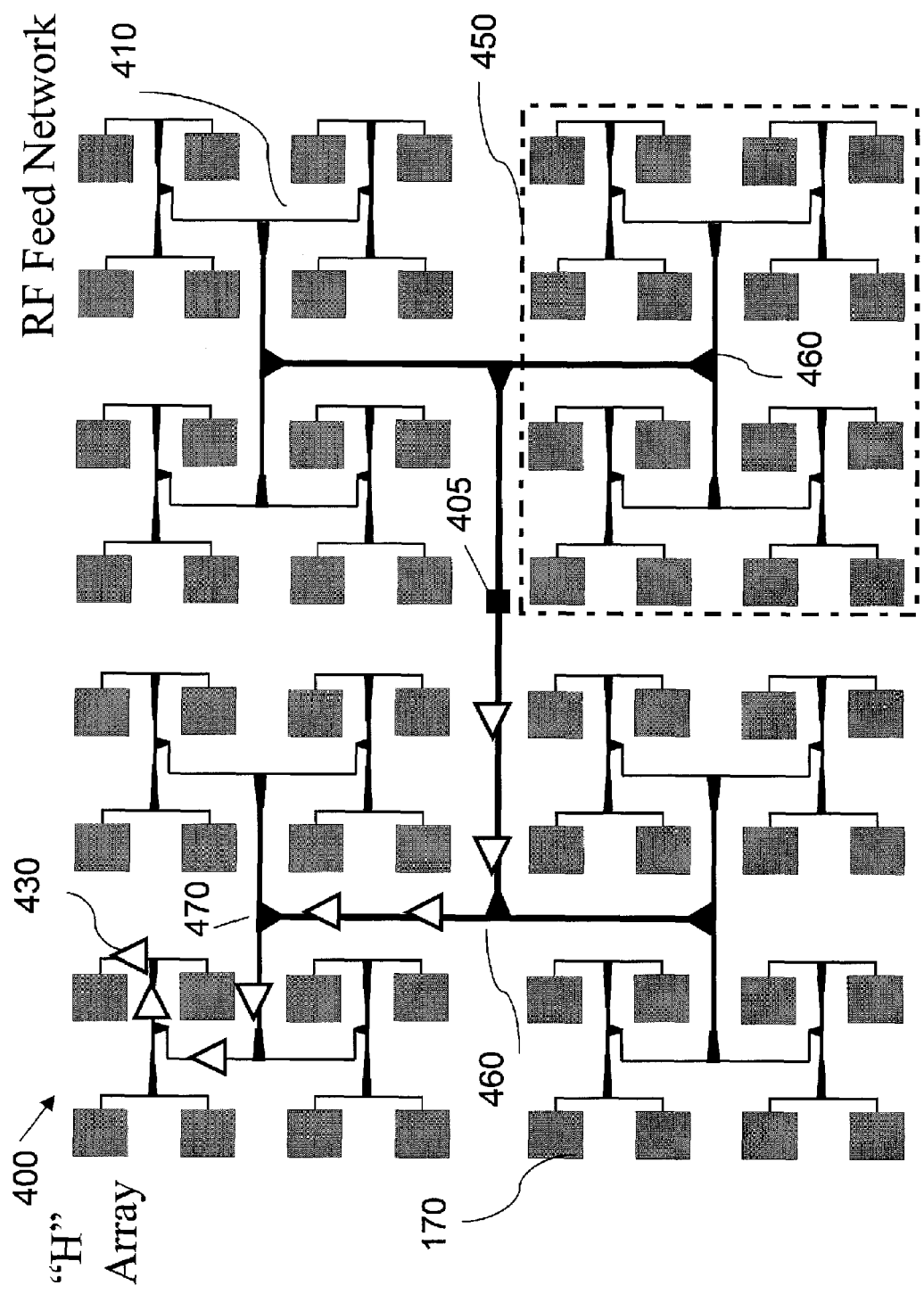
FIG. 1 is an illustration of a wafer scale resonant transmitting network.

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

An ultra wideband (UWB) radar is provided that incorporates the pulse shaping advances disclosed in U.S. application Ser. No. 11/454,915 to provide a UWB radar having pulse widths of just tens of picoseconds. Given such extremely narrow pulses, the range resolution is correspondingly enhanced. For example, if a radar is transmitting non-coded pulses, the range resolution is generally around 2.5 times the pulse width times the speed of light in the transmission medium. An UWB radar transmitting 20 picosecond pulses into free space can thus provide a range resolution of just a few millimeters. However, such extremely narrow pulses will be dispersed if transmitted through a transmission network such as a coplanar waveguide (CPW) network before being propagated by the UWB radar's antennas.

To avoid this dispersion, embodiments of the disclosed UWB radar use the distributed oscillator architecture disclosed in U.S. Application. Ser. No. 11/536,625, filed Sep. 28, 2006, the contents of which are incorporated by reference. In this fashion, a wafer scale (integrated with a semiconductor wafer) UWB radar is enabled in which a resonant transmission network with distributed amplification is driven by a triggering pulse waveform such that the entire transmission network oscillates acting as a distributed oscillator. Advantageously, the RF signal from the resulting distributed oscillator thereby arrives synchronously at a plurality of integrated antenna circuits coupled to the distributed oscillator. Each integrated antenna circuit may include a modulator such as the pulse shaping circuit disclosed in U.S. application Ser. No. 11/454,915. In this fashion, ultra wideband pulses may be propagated from the resulting wafer scale antenna module without incurring dispersion caused by propagation of the pulses through a transmission network. Significantly, however, such ultra wideband pulses may be generated without the need for oscillators such as a voltage controlled oscillator (VCO) in each integrated antenna circuit.

As set forth in U.S. application Ser. No. 11/536,625, a particularly advantageous transmission network with regard to a wafer scale approach is a coplanar waveguide (CPW) network. Although embodiments of the disclosed UWB radar include the use of any suitable architecture for a transmission network such as CPW, microstrip, and planar waveguide, CPW enjoys superior shielding properties over microstrip. Thus, the following discussion will assume without loss of generality that the transmission network is implemented using CPW. This network may be arranged in an "H" array such that the electrical length from an RF input port to any given integrated antenna circuit is the same as that to all the remaining integrated antenna circuits. Although CPW has superior shielding properties, the RF propagation across a CPW network on a semiconductor wafer such as an 8" wafer may introduce losses as high as 120 dB. To counteract such losses, a plurality of distributed amplifiers may be coupled to the CPW network as disclosed in U.S. application Ser. No. 11/141,283. For example, a first linear transistor amplifier (which may be denoted as a driving amplifier) amplifies a received RF signal into a length of the CPW network into a second linear transistor amplifier (which may be denoted as a matching amplifier) configured to match its output impedance to the characteristic impedance of the CPW network. Both the gain of the driving amplifier and the gain and the output impedance of the matching amplifier are tuned using reactive loads such as integrated inductors. In this fashion, resistive losses are minimized. These gains may be maintained so that linear operation is achieved. In this fashion, an RF signal driven into an input port of the CPW network is linearly amplified and propagated to the integrated antenna circuits, despite the transmission line losses.

As disclosed in U.S. application Ser. No. 11/536,625, it has been observed that the combination of the resulting active devices and the transmission network can be tuned to form a resonant network. Because the network is resonant, a globally-synchronized oscillation can be induced by triggering the network with an appropriate timing signal. The distributed amplifiers thus injection lock to each other such that the resonant network forms a distributed oscillator providing each antenna with a globally synchronized RF signal. This RF signal may then be modulated if desired such as through the pulse shaping circuit of U.S. application Ser. No. 11/454,915. In addition, the RF signal received at the antennas may be phase shifted for beamforming purposes using a phase shifter such as the analog phase shifter in U.S. application Ser. No. 11/535,928 (the contents of which are incorporated by reference) or any other suitable phase shifter such as disclosed in U.S. application. Ser. No. 11/182,344.

Turning now to FIG. 1, a resonant half-duplex transmission network 410 for an 8×8 subarray of antenna elements 170 is implemented in an 8" wafer scale radar module 400. The triggering signal to trigger the resonant oscillation is injected into a center feed point 405. Distributed amplifiers 430 coupled to the network then injection lock to each other such that each antenna 170 may receive a globally synchronized RF signal. The transmission network may be single-ended or differential. In one embodiment, the network may comprise a coplanar waveguide (CPW) having a conductor width of a few microns (e.g., 4 microns). With such a small width or pitch to the network, an array of antenna elements may be readily networked in an 8 inch wafer substrate for, for example, 60 GHz operation.

Figure 2:
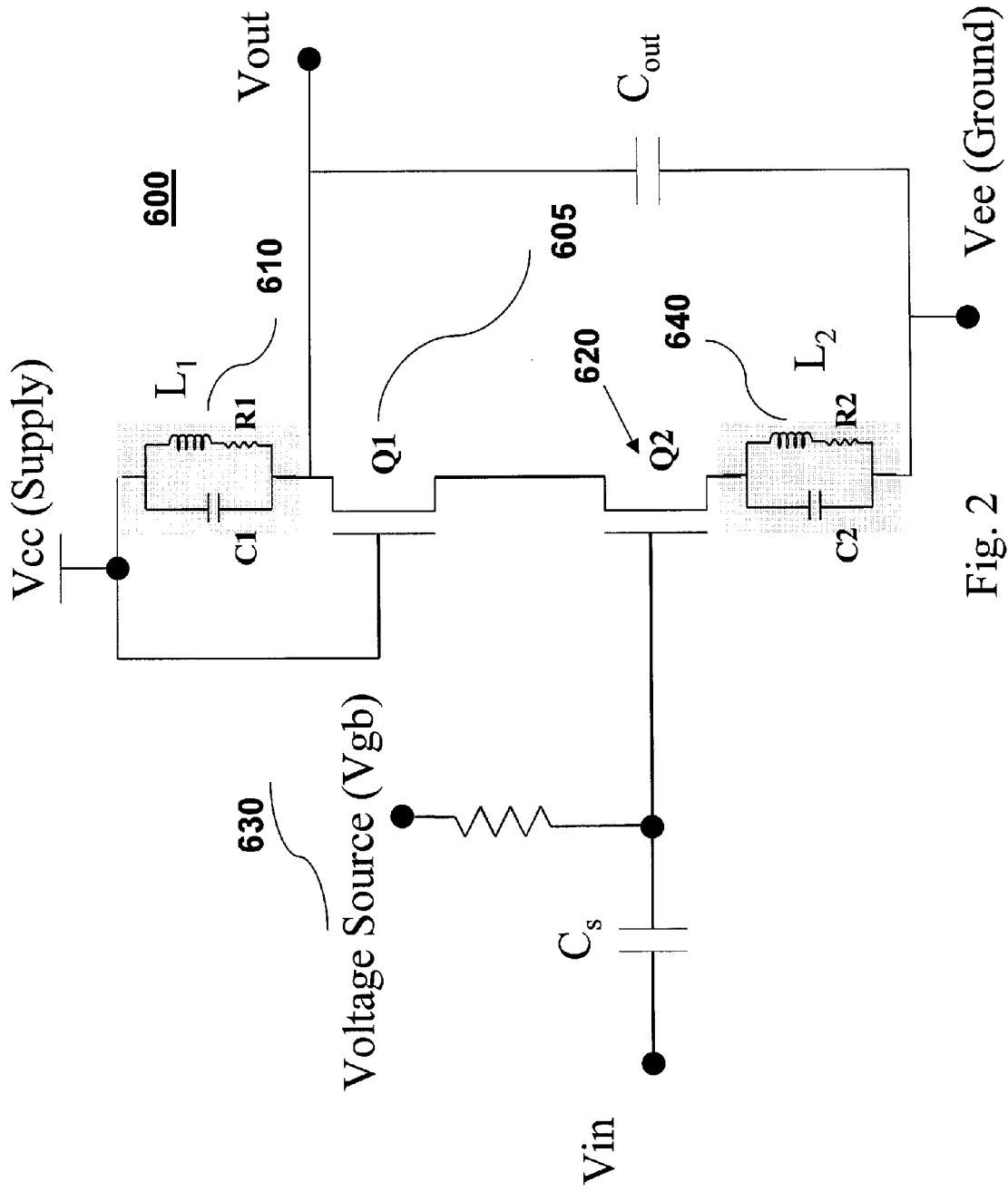
FIG. 2 is a schematic illustration of a driving amplifier for the resonant transmitting network of FIG. 1.

The design of the distributed amplifiers is not critical so long as they provide sufficient amplification and achieve a resonant operation with the transmission network. Thus, it will be appreciated that the distributed amplifiers may comprise the driving/matching amplifiers discussed below or alternative distributed amplifiers may be used. In one embodiment, a driving amplifier in the receiving and transmission networks is followed by a matching amplifier for efficient performance. An exemplary embodiment of a FET-based matching amplifier 600 is illustrated in FIG. 2. Matching amplifier 600 couples to a coplanar waveguide network (not illustrated) at input port Vin and output port Vout. An analogous BJT-based architecture may also be implemented. The FETs may be either NMOS or PMOS. A first NMOS FET Q1 605 has its drain coupled through an integrated inductor (L1) 610 to a supply voltage Vcc. This integrated inductor L1 may be formed using metal layers in a semiconductor manufacturing process as discussed in commonly-assigned U.S. Pat. No. 6,963,307, the contents of which are incorporated by reference. Because such an integrated inductor L1 will also have a stray capacitance and resistance, these stray effects are modeled by capacitor C1 and resistor R1. The metal layers in the semiconductor process may also be used to form a DC blocking capacitor CS and an output capacitor $C_{out}$. The supply voltage also biases the gate of Q1. Q1 has its drain driving Vout and its source coupled to a second NMOS FET Q2 620. A voltage source 630 coupled through a high value resistor or configured transistor biases the gate of Q2 620 with a voltage Vgb (whereas in a BJT embodiment, the base of Q1 is biased by a current source). The source of Q2 620 couples to ground through an integrated inductor (L2) 640. Analogous to inductor 610, inductor 640 has its stray capacitance and resistance modeled by capacitor C2 and resistor R2. It may be shown that an input resistance Rin for amplifier 600 is as follows:

$$Rin=(gm)*L2/Cgs$$

where gm is the transconductance for Q2 620, L2 is the inductance of the inductor 640 and Cgs is the gate-source capacitance for Q2 620. Thus, Q2 620 and inductor 640 characterize the input impedance and may be readily designed to present a desired impedance. For example, if an input resistance of 50Ω is desired (to match a corresponding impedance of the CPW network), the channel dimensions for Q2 and dimensions for inductor 640 may be designed accordingly. The gain of matching amplifier 600 is proportional to the inductance of L1.

Figure 3:
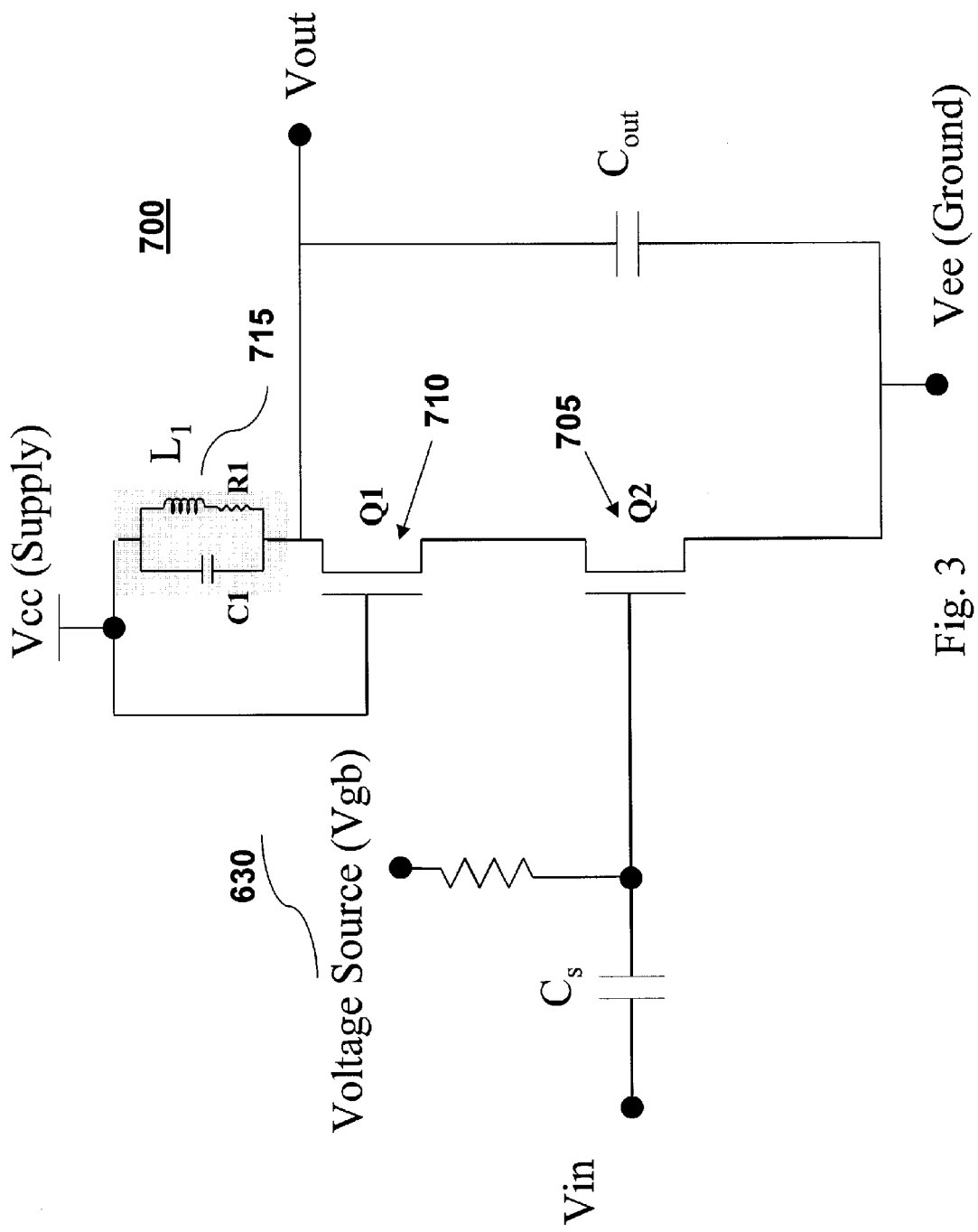
FIG. 3 is a schematic illustration of a driving amplifier for the resonant transmitting network of FIG. 2.

An exemplary driving amplifier 700 is illustrated in FIG. 3. Driving amplifier 700 is constructed analogously to matching amplifier 600 except that no inductor loads the source of Q2 705 (alternatively, an inductor having a fraction to 1/10 the inductance of L1 may load the source of Q2). The gain of driving amplifier 700 is proportional to the inductance of L1. A transistor Q1 710 has its drain loaded with integrated inductor L1 715 in a similar fashion as discussed with regard to Q1 605 of matching amplifier 600. Inductor 715 determines a center frequency Fd for driving amplifier 700 whereas both inductors 640 and 610 establish a resonant frequency Fm for matching amplifier 600. It may be shown that the band-pass center frequency Fc of a series-connected driving and matching amplifier is given as $$Fc=1/2*sqrt(Fd^2+Fm^2)$$

Referring back to FIG. 1, a series of driving amplifier/matching amplifier pairs 430 are shown coupling feed point 405 to a first network intersection 460. In such an "H" configured network array, network 410 will continue to branch from intersection 460 such as at an intersection 470. For illustration clarity, the distribution of the driving amplifier/matching amplifier pairs 430 is shown only in selected transmission paths in FIG. 1. It will be appreciated that both the driving amplifiers and the matching amplifiers may be constructed using alternative arrangements of bipolar transistors such as PNP bipolar transistors or NPN bipolar transistors. In a bipolar embodiment, biasing voltage sources 630 are replaced by biasing current sources. In addition, the RF feed network and these amplifiers may be constructed in either a single ended or differential fashion. DC and control lines may be arranged orthogonally to the RF distribution direction for isolation.

Figure 4:
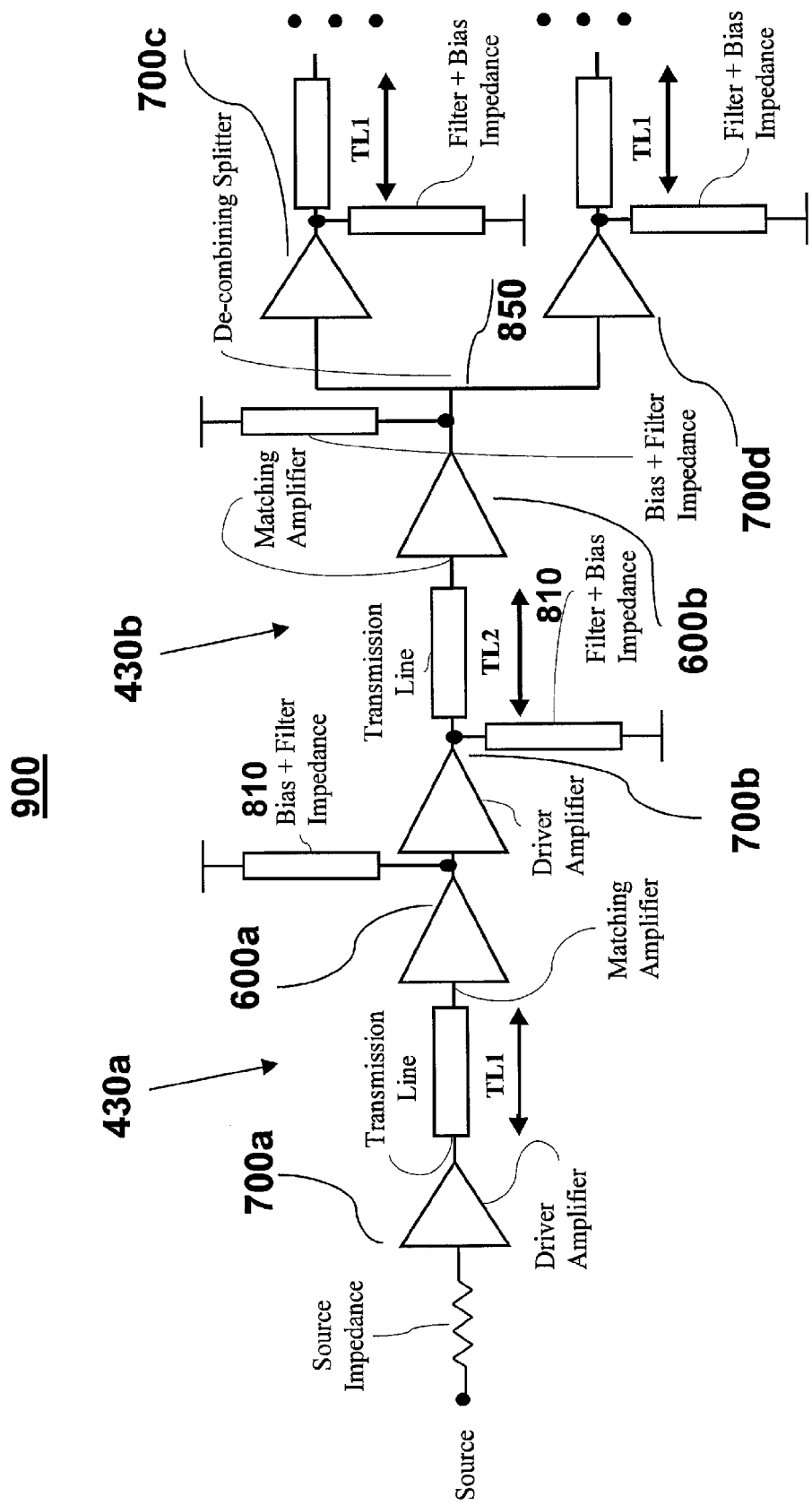
FIG. 4 illustrates a section of the resonant transmitting network of FIG. 11.

The resonant network properties are influenced by the distance between driving amplifiers and matching amplifiers in successive driving amplifier/matching amplifier pairs. For example, as seen for RF network portion 900 in FIG. 4, its input or source is received at a first driver amplifier 700*a*, which drives a matching amplifier 600*a* separated from driver 700*a* by a length of network transmission line (such as coplanar waveguide) of length TL1. Driver amplifier 700*a* and matching amplifier 600*a* thus constitute a first driving amplifier/matching amplifier pair 430*a*, which may also be denoted as a load balanced amplifier (LBA). Matching amplifier 600*a* is immediately followed by a driver amplifier 700*b*, which couples to the output of matching amplifier 600*a* directly in the active circuitry semiconductor substrate rather than through a transmission line section. In this fashion, die space on the wafer substrate is conserved. However, it will be appreciated that an RF network CPW transmission line segment could also be used to couple matching amplifier 600*a* to driving amplifier 700*b*. Driver amplifier 700*b* drives a matching amplifier 600*b* separated from driver 700*b* by a length TL2 of network transmission line. Driver amplifier 700*b* and matching amplifier 600*b* thus form a second driving amplifier/matching amplifier 430*b*. The necessary biasing and inductance loading as described with respect to FIGS. 2 and 3 are represented by bias and filter impedances 810. In general, the sum of TL1 and TL2 should equal one half of the center frequency wavelength. By changing the ratio of TL1/TL2 and the output capacitance, a maximum stable gain of approximately 20 to 30 dB may be obtained for 10 GHz to, for example, 40 GHz operation. In a linear amplification (as opposed to resonant operation) 10 GHz embodiment, stable gain and frequency performance may be realized for a capacitance load of 50 fF as TL1/TL2 is varied from 40% to 80%.

The integration of the CPW network and the distributed amplification into a wafer scale integrated radar antenna module (WSAM) may be better understood by classifying the WSAM into three layers. The first layer would be a semiconductor substrate, such as silicon. On a first surface of the substrate, antennas such as patches for the integrated antenna circuits are formed as discussed, for example, in U.S. Pat. No. 6,870,503, the contents of which are incorporated by reference herein. Active circuitry for the corresponding integrated antenna circuits that drive these antennas are formed on a second opposing surface of the substrate. The CPW transmission network is formed adjacent this second opposing surface. The second layer would include the antennas on the first side of the substrate whereas the third layer would include the CPW network. Thus, such a WSAM includes the "back side" feature disclosed in U.S. application Ser. No. 10/942,383, the contents of which are incorporated by reference, in that the active circuitry and the antennas are separated on either side of the substrate. In this fashion, electrical isolation between the active circuitry and the antenna elements is enhanced. Moreover, the ability to couple signals to and from the active circuitry is also enhanced. As discussed in U.S. application Ser. No. 10/942,383, a heavily doped deep conductive junction through the substrate couples the active circuitry to vias/rods at the first substrate surface that in turn couple to the antenna elements. Formation of the junctions is similar to a deep diffusion junction process used for the manufacturing of double diffused CMOS (DMOS) or high voltage devices. It provides a region of low resistive signal path to minimize insertion loss to the antenna elements.

Upon formation of the junctions in the substrate, the active circuitry may be formed using standard semiconductor processes. The active circuitry may then be passivated by applying a low temperature deposited porous SiOx and a thin layer of nitridized oxide ($Si_xO_yN_z$) as a final layer of passivation. The thickness of these sealing layers may range from a fraction of a micron to a few microns. The opposing second surface may then be coated with a thermally conductive material and taped to a plastic adhesive holder to flip the substrate to expose the first surface. The substrate may then be back ground to reduce its thickness to a few hundreds of micrometers.

An electric shield may then be sputtered or alternatively coated using conductive paints on background surface. In addition, parts of the shield form ohmic contacts to the junctions. For example, metallic lumps may be deposited on the junctions. These lumps ease penetration of the via/rods to form ohmic contacts with the active circuitry.

Figure 5:
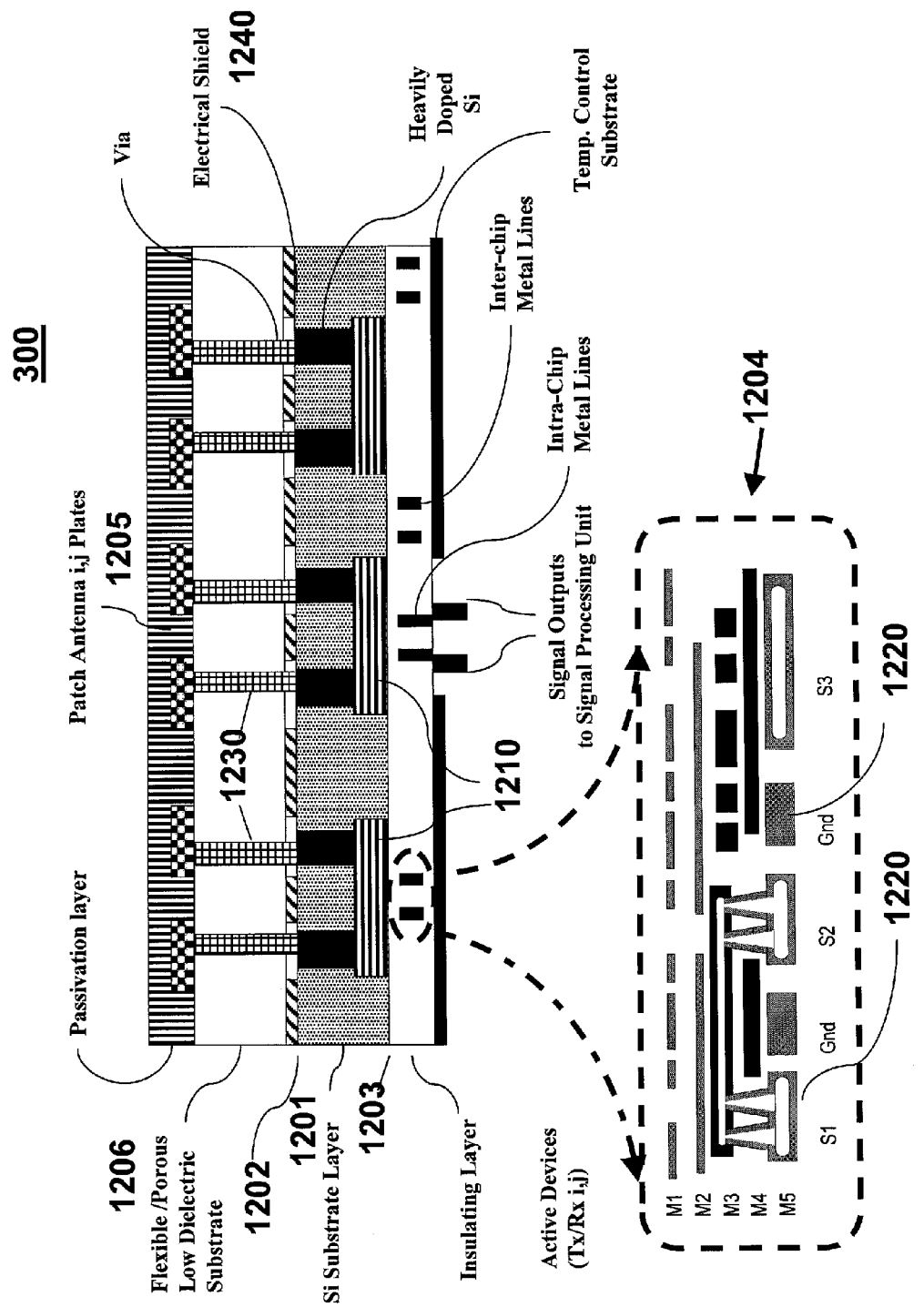
FIG. 5 is a cross-sectional view of an wafer scale radar antenna module (WSAM) having the coplanar waveguide resonant transmitting network of FIG. 1.

In an alternative embodiment, the CPW network may be integrated on the antenna side of the substrate. Because the backside approach has the isolation and coupling advantages described previously, the following discussion will assume without loss of generality that the RF feed network is integrated with the substrate in a backside embodiment. For example as seen in cross-section for an exemplary WSAM 300 shown in FIG. 5, a semiconductor substrate 1201 has opposing surfaces 1202 and 1203. Antenna elements 1205 such as patches are formed on a dielectric layer 1206 adjacent to surface 1202. Active circuitry 1210 integrated with substrate 1201 includes the driving and matching amplifiers for an RF feed network 1204 having CPW conductors S1 and S2. Adjacent surface 1203, metal layer M1 includes inter-chip and other signal lines. Metal layer M2 forms, among other things, a ground plane for CPW conductors S1 and S2, which are formed in metal layer 5 as well as ground plates 1220. Metal layer M4 provides a connecting layer to couple CPW conductors together as necessary. The driving and matching amplifiers within active circuitry 1210 couple through vias (not illustrated) in apertures in the ground plane in metal layer M2 to CPW conductors S1 and S2. This active circuitry may also drive antennas 1205 through a plurality of vias 1230 that extend through the dielectric layer. An electric shield layer 1240 isolates the dielectric layer from surface 1202 of the substrate. The antennas may be protected from the elements and matched to free space through a passivation layer.

Just as active circuitry is distributed across the CPW network for amplification (using, e.g., the matching and driving amplifiers discussed previously), active circuitry may also be used to form distributed phase shifters and pulse shaping circuits as will be explained further herein. The location of these components depends upon the granularity desired for the beam steering and pulse shaping capability. For example, referring back to FIG. 1, each antenna element 170 could receive individual phase shifting through an adjacent and corresponding distributed phase shifter. To save costs and reduce power consumption, subsets of antenna elements 170 may share in the phase shifting provided by a corresponding distributed phase shifter. For example, consider a subset 450 having sixteen antenna elements 170. As seen in FIG. 1, a distributed phase shifter located adjacent an intersection 460 of network 410 would provide equal phase shifting for each of the elements within a subset 450. Similar subsets would have their own distributed phase shifter. Thus, it may be appreciated that the granularity of the beam steering capability is a design choice and depends upon desired manufacturing costs, power consumption, and associated complexity.

Figure 6:
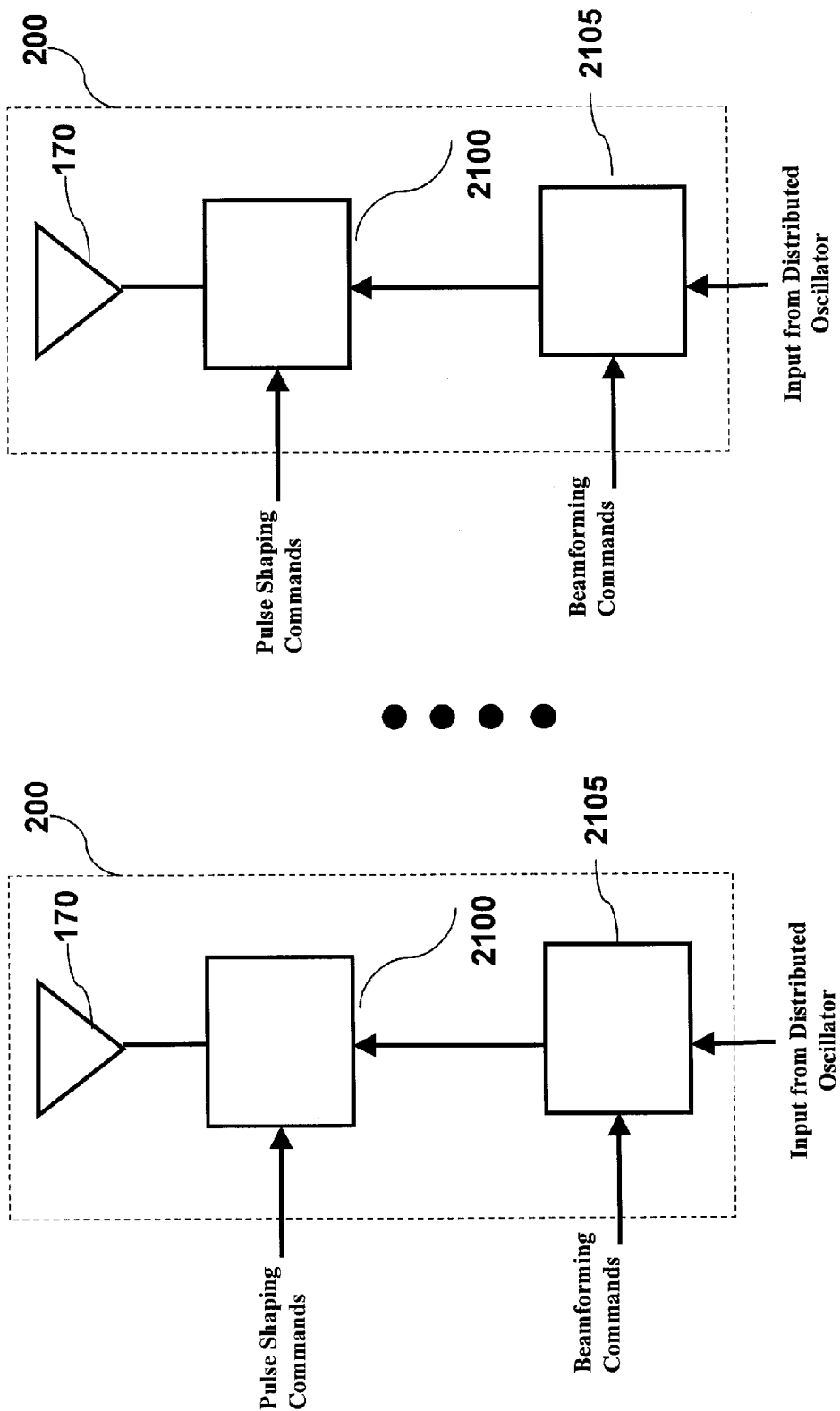
FIG. 6 is a block diagram of integrated antenna circuits for the WSAM of FIG. 5.

Because a distributed oscillator approach will advantageously provide global synchronization at each antenna, the following discussion will assume that each antenna associates with its own phase-shifter and pulse shaping circuit. For example as seen in FIG. 6, each combination of a phase-shifter 2105, a pulse shaping circuit 2100, and an antenna 170 may be considered to form an integrated antenna circuit 200, which is denoted as "integrated" because the active circuitry needed to form the phase-shifters and pulse shaping circuits is integrated into the wafer substrate as discussed with regard to FIG. 5. However, it will be appreciated that the granularity of the phase-shifting and/or pulse shaping may be varied such that multiple antennas share a single phase shifter and/or pulse shaping circuit. Regardless of the granularity, each integrated antenna circuit receives a globally synchronized RF signal from the distributed oscillator/CPW resonant transmission network.

It is believed that the resonant frequency of the resonant transmission network illustrated in FIG. 1 depends on the number of the distributed amplifiers (entire length of transmission line) from central triggering point 405 reaching to each individual integrated antenna circuit. For example, it is believed that resonant oscillation may be achieved for a 128 quarter wavelength transmission distance from point 405 to each integrated antenna circuit with TL1=400 micron and TL2=1250 micron, a Q1 current sink ability of 15× that of Q2 (in both driver and matching amplifier) with 2× source ability and a triggering pulse width of 20 pS and repetition rate of 3600 pS produces a steady state oscillation of 600 mV and frequency of 20 GHz at the termination point for appropriate values of the resonant loads. Advantageously, such 20 GHz distribution need may consume only 30 mV across the wafer. Changing the pulse triggering repetition to 400 pS and reducing the load to 3× and the sink to 3× with regard to the minimum geometry for the Q1 and Q2 transistors yields a 33 GHz oscillation frequency. Further reduction of transistor Q1 to 1× and Q2 to 1× results in a frequency of oscillation close to 45 GHz. In general, as the number of distributed amplifiers in increased in the resonant network, the resonant oscillation period will increase due to the parasitic loading from the increased number of active devices.

Figure 7:
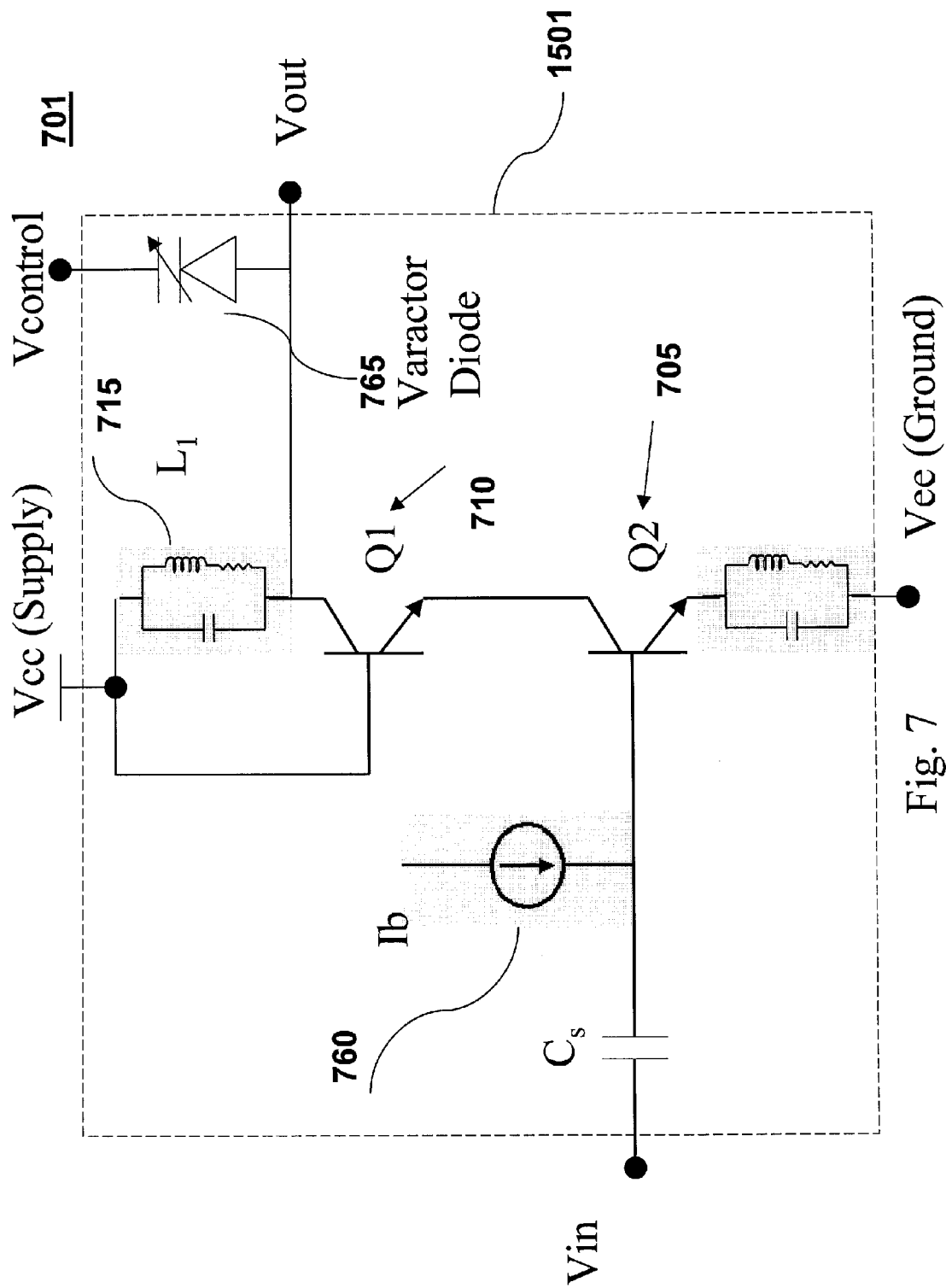
FIG. 7 is a circuit diagram of a stage for the phase-shifters of FIG. 6.

Referring again to FIG. 6, each phase-shifter 2105 may be formed using any suitable means such as the selectable delay lines discussed in U.S. application Ser. No. 11/454,915. A particularly advantageous analog phase shift may be achieved in a distributed phase-shifter at relatively constant gain using a variable capacitor array phase shifter (VCAPS) as follows. Each distributed VCAPS may use one or more driver amplifiers/variable capacitor stages where stage includes a modified driver amplifier. This modified driver amplifier has the output capacitor discussed with regard to FIG. 3 replaced by a varactor. A bipolar-based VCAPS stage 701 is illustrated in FIG. 7. As discussed analogously with regard to driver amplifier 700, VCAPS stage 701 includes a DC blocking capacitor $C_S$ between the base of BJT transistor Q2 and an input voltage node Vin. In addition, the base of Q2 is biased by a current source 760 that provides a bias current $I_b$. As discussed analogously with regard to matching amplifier 600, the gain of VCAPS stage 701 is proportional to the inductance of an integrated inductor L 1 that loads an output node Vout. The collector of BJT Q2 couples to an emitter of a BJT Q1 whose collector couples to the loaded output node Vout. An optional integrated inductor L2 loads the emitter of BJT Q2. Typically, the inductance of L2 should be a fraction to approximately $1/10^{th}$ that of L1. Integrated inductor L2 functions to better match stage 701 so as to reduce reflected energy back through input node Vin. In addition to being loaded by the integrated inductor L1, the output node is also loaded by a varactor diode 765. Each varactor diode may be implemented using a PIN diode, n+/p−, or p+/n−, or MOS variable capacitor. A control voltage Vcontrol controls the capacitance of the varactor diode.

VCAPS stage 701 takes advantage of the following remarkable phase and gain variation discussed in U.S. application Ser. No. 11/535,928. In particular, the variation of phase shift and gain between input node Vin and output node Vout of VCAPS stage 701 may be configured such that the gain is relatively constant yet the phase change is pronounced as the capacitance of the varactor diode is changed. By changing the bias current Ib and the inductance of L1 appropriately, it will be appreciated that such a "pivot point" maximal-phase-shift-yet-constant-gain performance may achieved for any desired frequency.

Stage 701 may thus be seen to comprise a linear transistor amplifier 1501 having an output node loaded by an integrated inductor and a diode varactor. The gain of the linear transistor amplifier is proportional to the inductance of the integrated inductor whereas the phase shift of a signal propagated through the linear transistor amplifier is proportional to a control voltage applied to the diode varactor. The control voltage is varied to provide the desired phase lag through the linear transistor amplifier. The gain of the linear transistor amplifier is also proportional to a bias signal. In a BJT-based embodiment, the bias signal comprises the bias current Ib whereas in a FET-based embodiment, the bias signal comprises a bias voltage Vgb as discussed analogously with regard to FIG. 3. Although a substantially constant gain performance is achieved if the signal frequency is maintained at the pivot point frequency despite variation of the varactor diode capacitance, there will always be some gain variation as Vcontrol is changed. Thus, the bias signal (Ib or Vgs, for example) may be changed in concert with a change in Vcontrol such that a constant gain performance is substantially achieved.

Figure 8:
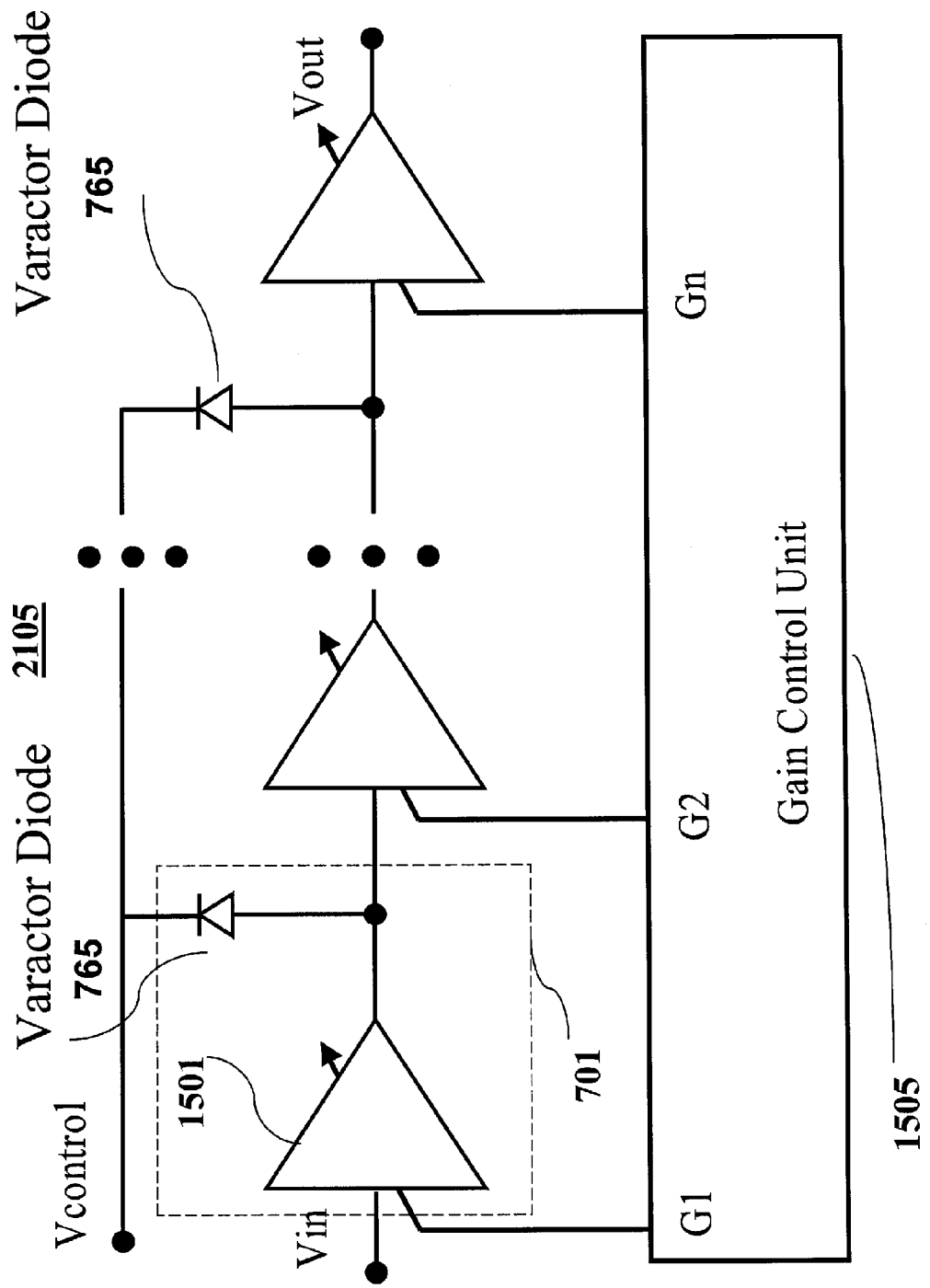
FIG. 8 is a block diagram of a phase-shifter comprised of multiple ones of the stages shown in FIG. 7.

A VCAPS phase-shifter 2105 having a plurality of stages 701 is illustrated in FIG. 8. Each stage includes a linear transistor amplifier 1501 having an output node loaded by a varactor diode 765. For example, in the BJT-based stage 701 of FIG. 7, linear transistor amplifier 1501 includes BJT transistors Q1 and Q2, inductors L1 and L2, blocking capacitor Cs and current source 760. Common control voltage Vcontrol controls the capacitance (and hence phase shift through each stage 701) of varactor diodes 765. The bias signal (such as Ib of FIG. 7) controlling the gains of amplifiers 1501 is provided by a gain control unit 1505. Unit 1505 may provide an individual bias signal to each linear transistor amplifier. Alternatively, a common bias signal may be provided by unit 1501. Similarly, unit 1505 may be common to each phase-shifter 2105. Alternatively, each phase-shifter 2105 may have its own gain control unit 1505.

Figure 9:
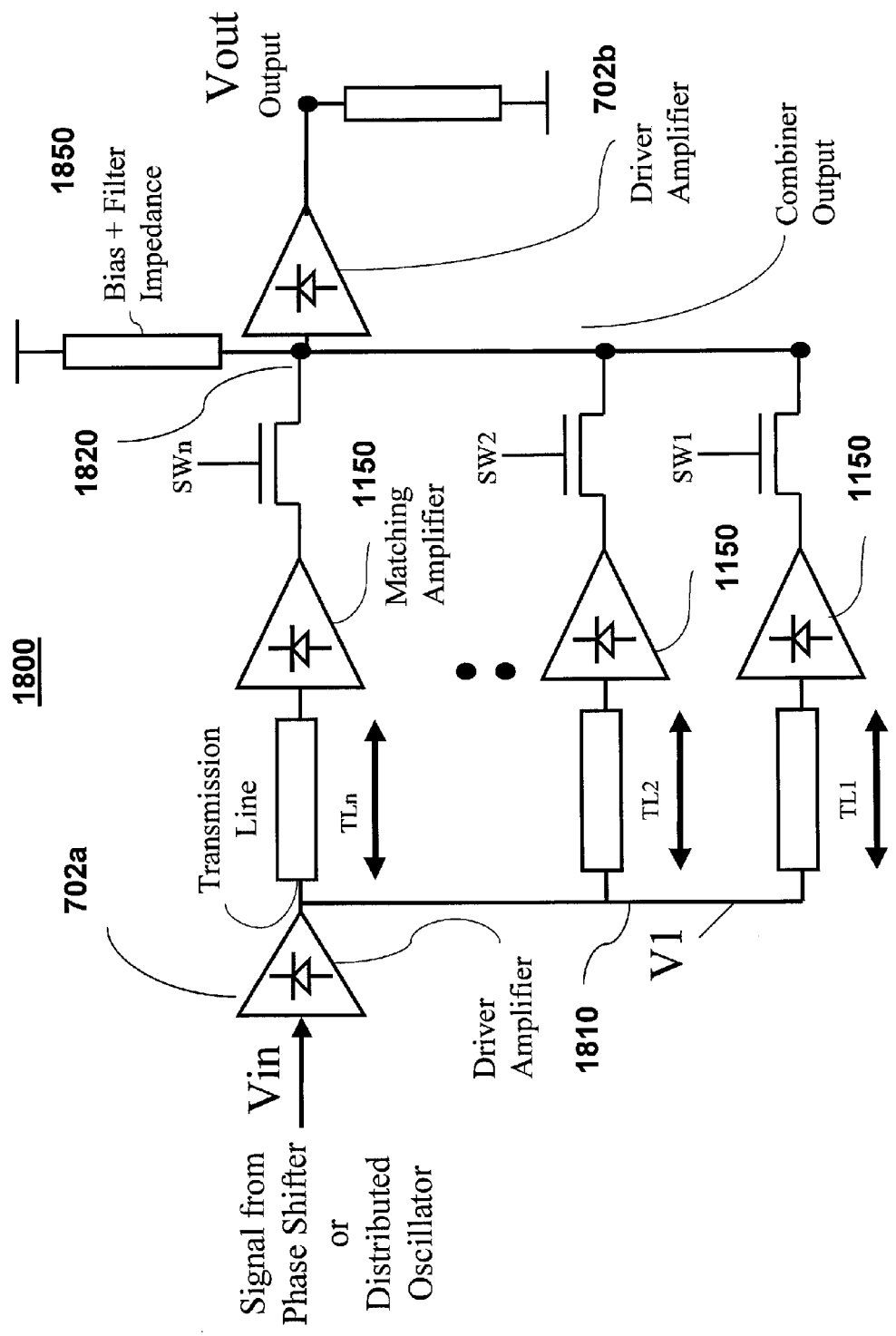
FIG. 9 is a circuit diagram of a pulse shaping circuit of FIG. 7.

An exemplary embodiment for pulse shaping circuit 2100 will now be discussed. Turning now to FIG. 9, a pulse shaping circuit 2100 receives an RF input signal. This input signal may come from phase-shifter 2105 in a beamforming embodiment or may be received directly from the distributed oscillator in a non-beamforming embodiment. Alternatively, the RF input signal may be received from the distributed oscillator in an integrated antenna circuit embodiment in which the phase-shifter follows the pulse shaping circuit. To generate pulses from the RF input signal, the pulse shaping circuit includes a driver amplifier driving selectable delay lines (formed as discussed with regard to the CPW network) whose outputs are combined through matching amplifiers at a node 1820. Because the RF input signal is level-shifted and rectified (as will be explained further) and delayed through selected transmission lines TL1 through TLn, an output voltage Vout will produce pulses of a desired width. The pulse width depends upon the selected transmission lines.

Figure 10:
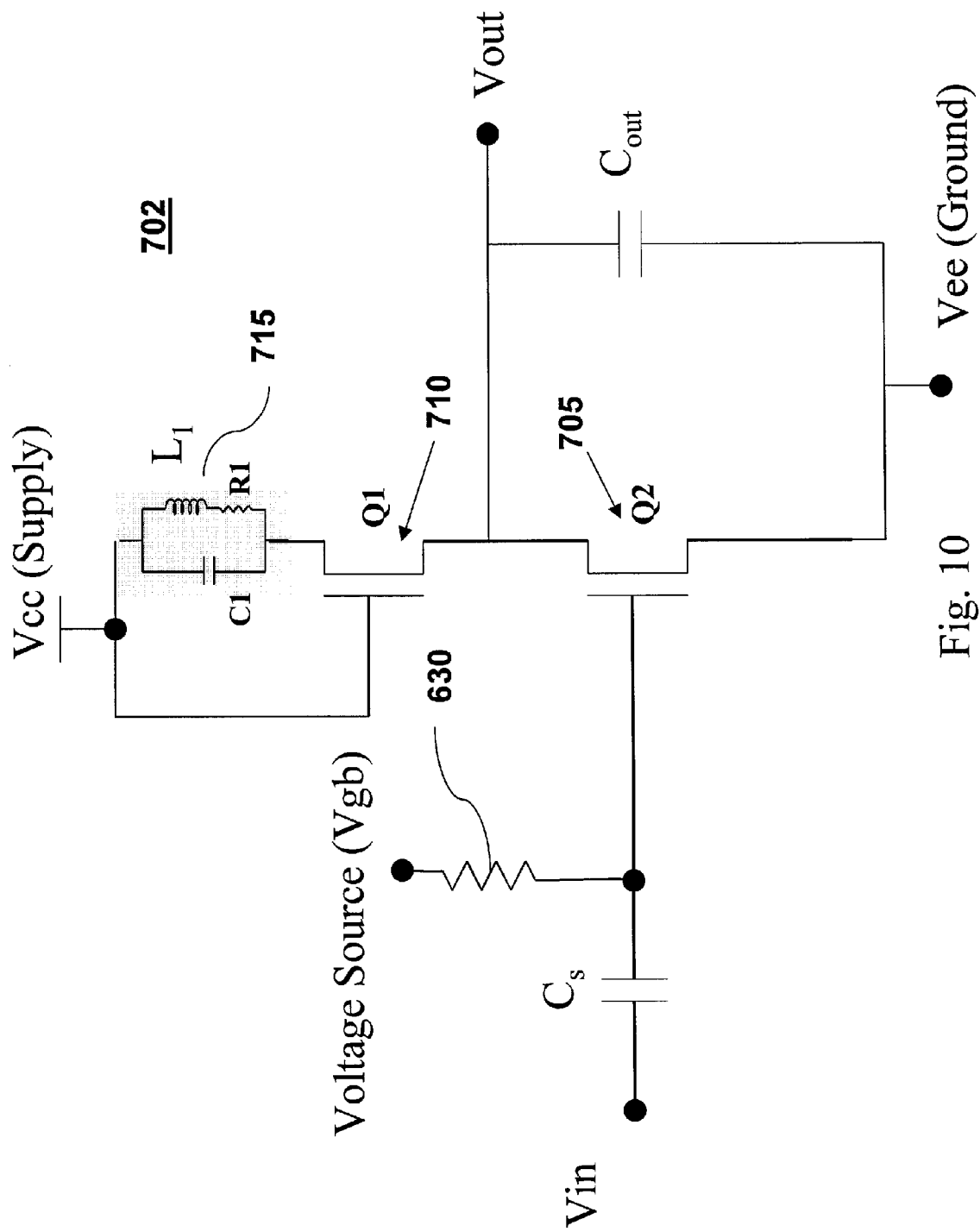
FIG. 10 is a schematic illustration of a driving amplifier for the pulse shaping circuit of FIG. 9.
Figure 11A:
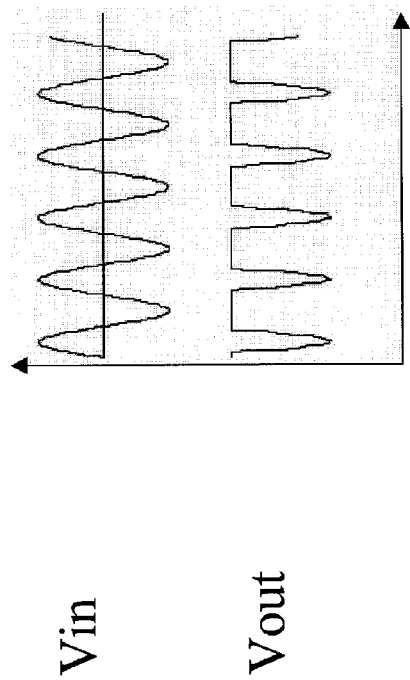
FIG. 11a illustrates the input and output voltage waveforms for a first driving amplifier in the pulse shaping of FIG. 9.

To provide the rectification and level-shifting, the driver and matching amplifiers are altered with regard to those discussed with regard to FIGS. 2 and 3 so as to operate in the saturation mode rather than in the linear mode. Turning now to FIG. 10, rectifying and level-shifting driver amplifier 702 differs from driver amplifier 700 in that the output voltage and the output capacitor couple between ground and the source (rather than the drain) of transistor Q1. Because transistor Q1 has approximately a diode drop of voltage across it (approximately 0.7 V), the output is then level-shifted this amount from VCC. The rectification comes about from the biasing of amplifier 702 such that it does not operate in the linear small-signal mode. Instead, amplifier 702 operates in the saturation mode. In this fashion, a first amplifier 702a as seen in FIG. 9 shifts and rectifies its output signal at a splitting junction 1810. This level shifting and rectifying of the sinusoidal input voltage to amplifier 702a may be better understood with regard to FIG. 11a, which illustrates waveforms for both the input voltage Vin and the output voltage Vout for amplifier 702a. As seen in FIG. 11a, the sinusoidal RF input signal is level-shifted and rectified to form the Vout signal.

Figure 12:
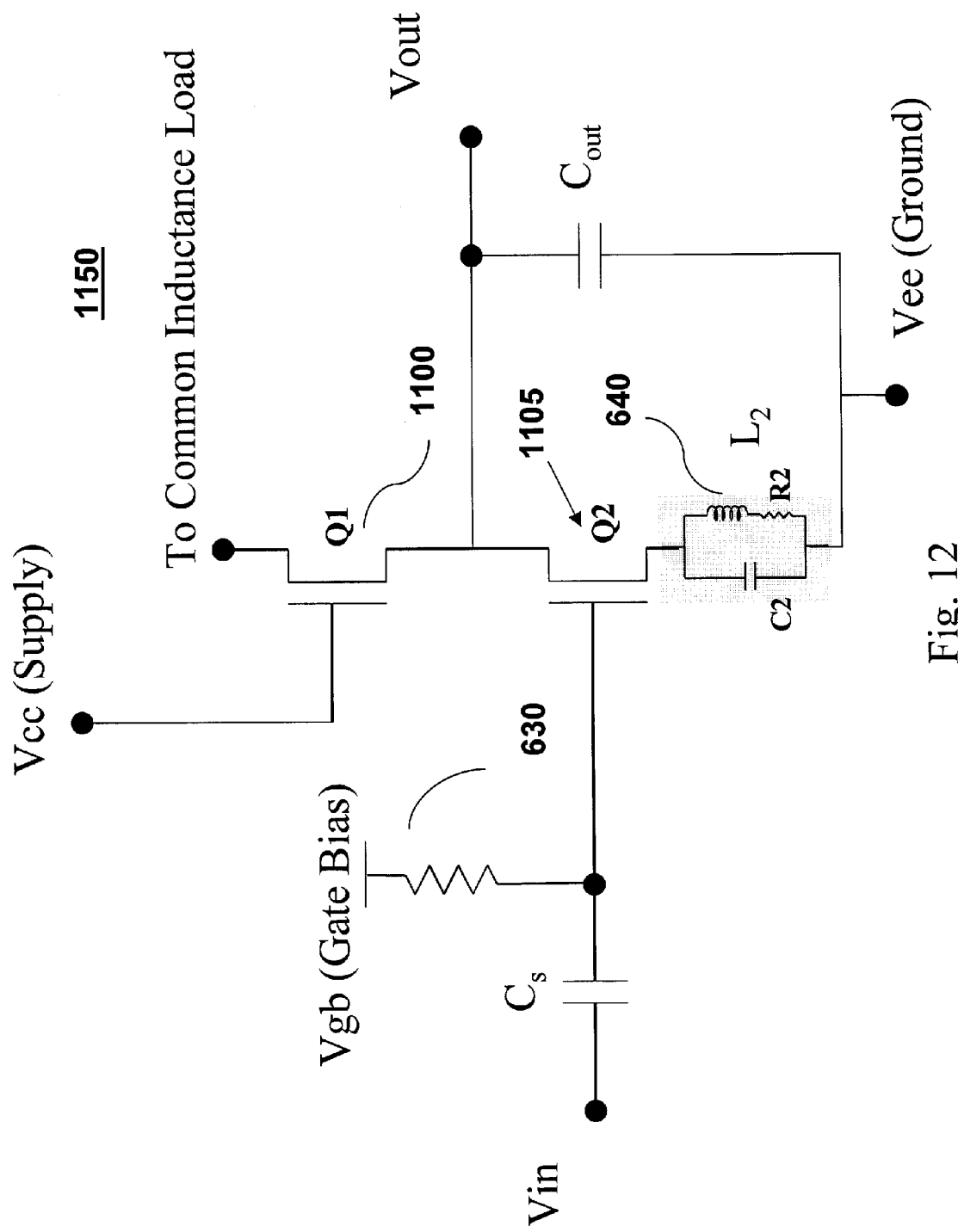
FIG. 12 is a schematic illustration of a combiner matching amplifier for the pulse shaping circuit of FIG. 9.

Amplifier 702 drives transmission lines TL1 through TLn (such as CPW segments) arranged in parallel between splitting junction 1810 and a combining junction 1820. These transmission lines have different electrical lengths through appropriate configuration. For example, in a CPW embodiment, the widths of the corresponding CPW conductors are varied accordingly. Each transmission line segment ends in a level-shifting and rectifying combiner matching amplifier. Turning now to FIG. 12, a level-shifting and rectifying combiner matching amplifier 1150 differs from matching amplifier 600 of FIG. 2 in that inductor L1 (represented by bias and filter impedance 1850) is shared by all the combiner matching amplifiers. In addition, the output voltage and output capacitor couple between ground and the source (rather than the drain) of transistor Q1. As discussed with regard to FIG. 10, such an output configuration provides a level-shifting effect of approximately 0.7 V due to the voltage change between the drain and source of Q1. As also discussed with regard to amplifier 702, combiner matching amplifier 1150 is biased to operate in the saturation mode rather than in the linear small-signal mode. An alternative embodiment for combiner matching amplifier 1150 may be formed by replacing the FETs with bipolar transistors.

Referring again to FIG. 18, it may be seen that if combiner matching amplifiers 1150 are constructed using BJT transistors, combining junction 1820 functions as a common collector node for transistor Q1 (referring back analogously to FIG. 12) in all the combiner matching amplifiers. Alternatively, if combiner matching amplifiers 1150 are constructed using FET transistors as illustrated in FIG. 12, combining junction

Figure 11B:
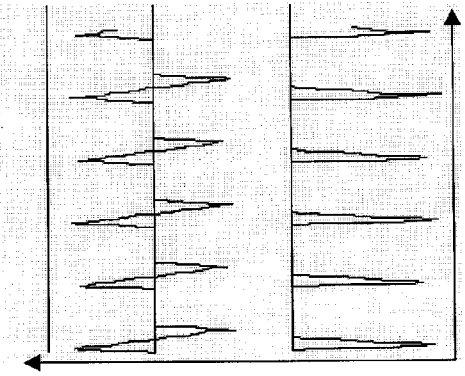
FIG. 11b illustrates the combining junction voltage waveforms and output voltage waveforms for the pulse shaping of FIG. 9.

1820 functions as a common source or drain node for Q1 (depending upon whether an NMOS or PMOS embodiment is implemented). Combining junction 1820 couples to the combiner matching amplifiers through corresponding switches such as FET switches SW through SWn. Each switch corresponds to a transmission line segment. For example, switch SW1 corresponds to transmission line segment TL1, switch SW2 to segment TL2, and so on. Depending upon which switches are activated, pulses of corresponding delay are coupled through to combining junction 1820. For example, suppose only switches SW1 and SW2 are closed. A given pulse delayed through transmission line segment/delay line TL2 will have a different delay than the same pulse delayed through transmission line segment TL1. These delayed pulses combine in a constructive and destructive fashion to produce a combined signal waveform at combining junction 1820 such as illustrated in FIG. 11*b*. This combined signal waveform is again level-shifted and rectified through a second driver amplifier 702*b* to provide an impulse signal output Vout also illustrated in FIG. 11*b*. It will thus be appreciated that, depending upon the selected delay times (corresponding to selected transmission line segments), pulse width may be modified on a pulse-to-pulse basis.

Figure 13:
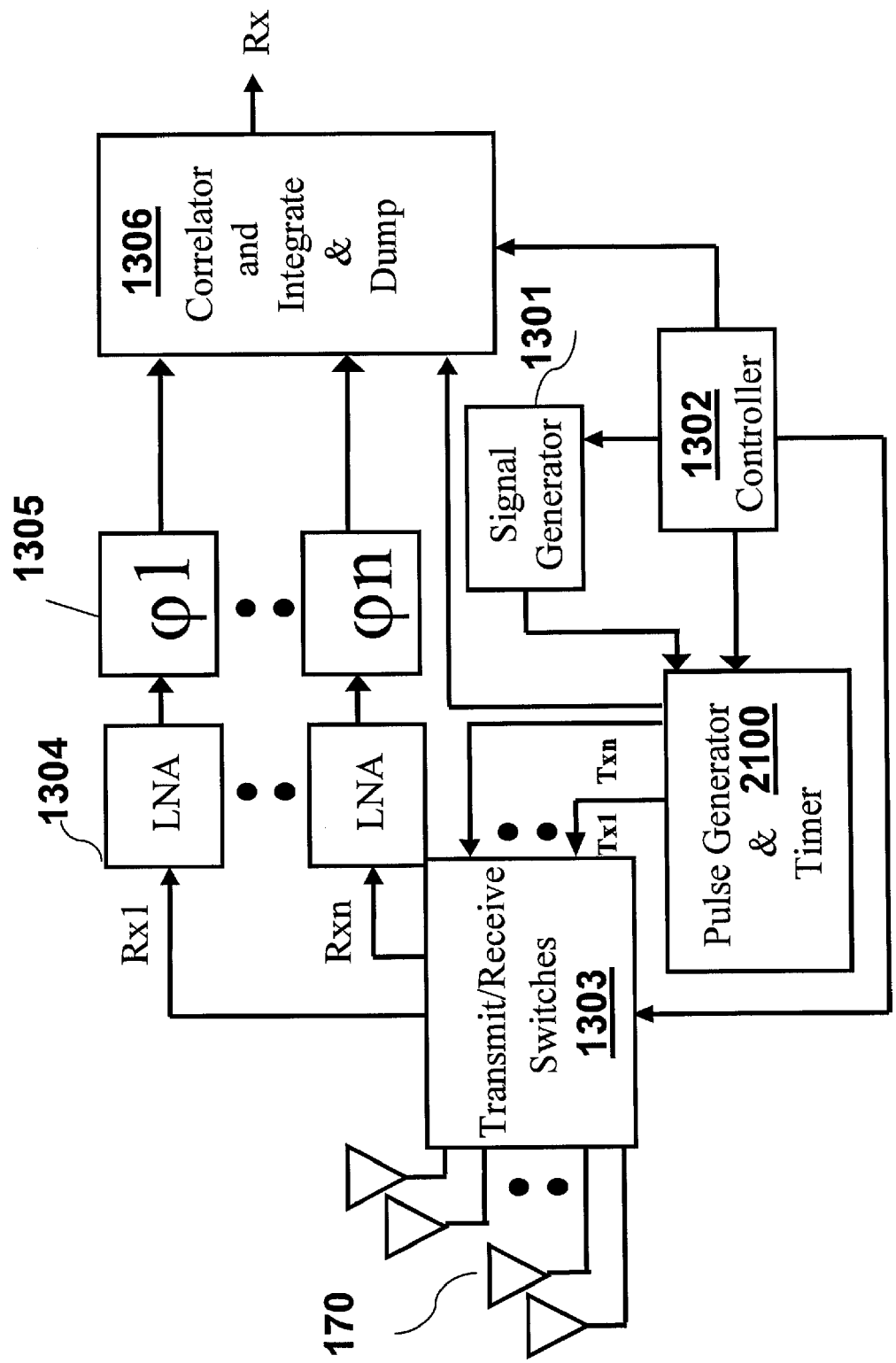
FIG. 13 is a block diagram of an exemplary wafer scale radar antenna module (WSAM)

A simplified block diagram of an exemplary WSAM 300 is illustrated in FIG. 13. The distributed oscillator is represented by signal generator 1301 which drives pulse shaping circuit 2100 under the control of a controller 1302. To allow the same antennas to be used for both transmitting and receiving the resulting UWB pulses, pulse shaping circuit 2100 couples to its antenna(s) 170 through transmit/receive switches 1303. Operation of WSAM 300 may be better understood with regard to FIG. 14, which illustrates the shaped pulses being generated by pulse shaping circuit 2100. For example, if the pulse shaping circuit is designed to operate on the harmonic of a 30 GHz distributed oscillator signal, shaped pulses may be generated at a 60 GHz rate. Controller 1302 controls switches 1303 such that only every nth shaped pulse is transmitted. Thus, the transmitted pulse repetition rate is considerably slower than the shaped pulse rate. For example, if the shaped pulses are generated at a 60 GHz rate, the transmitted pulse repetition rate may be only 3 to 4 GHz. By varying the time separation between pulses (making n larger), the pulse repetition rate may be changed as desired. The WSAM monitors time/range resolution bins at the pulse shaping rate. For example, if the pulses are generated at 60 GHz, the time bins illustrated in FIG. 14 each have an extent of the corresponding 60 GHz period. In general, if every nth pulse from the pulse shaping circuit is transmitted, then n−1 time bins may be monitored by WSAM 300 for targets. Alternative time bin configurations may be used to detect targets.

Figure 14:
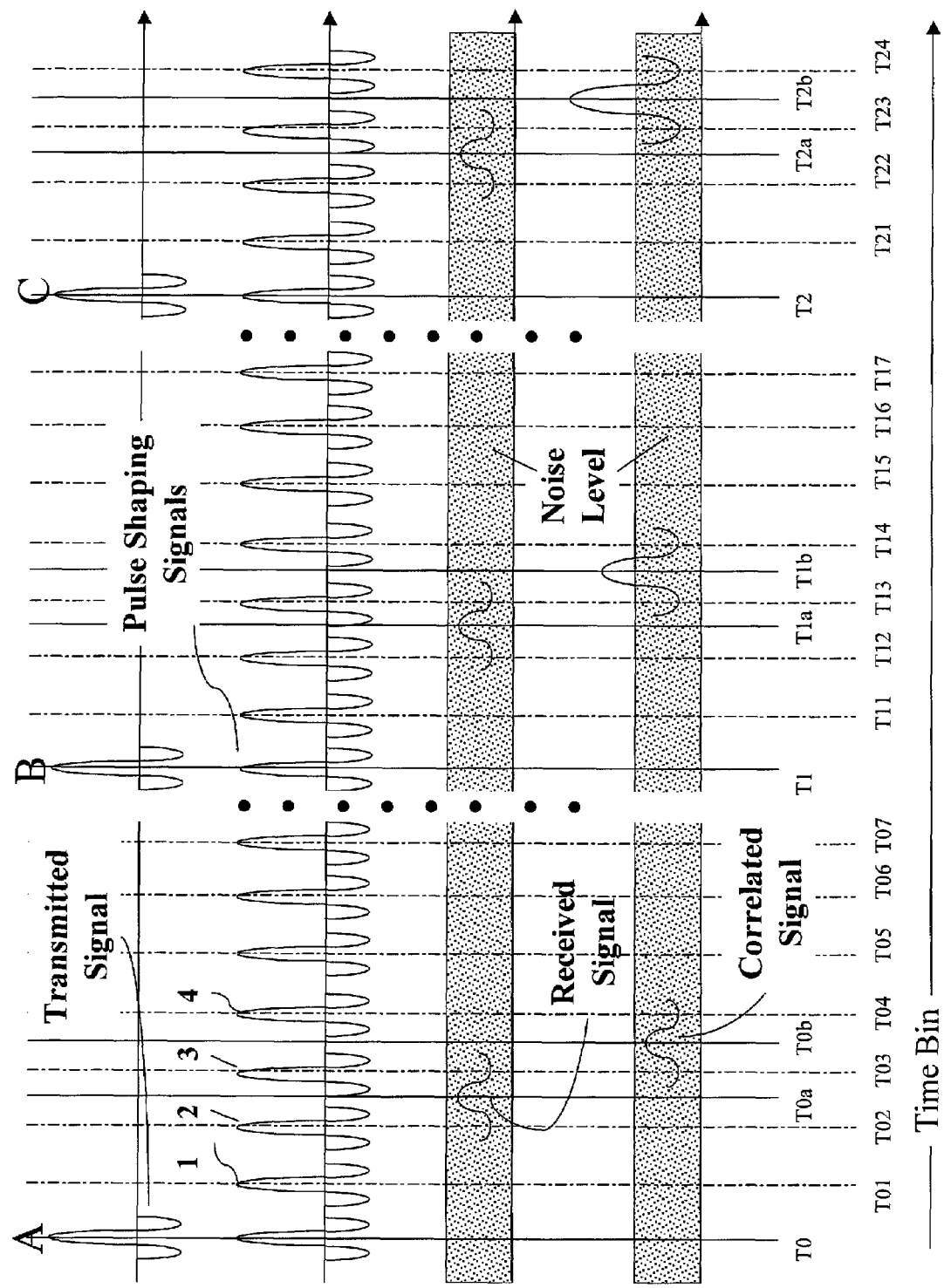
FIG. 14 illustrates various transmitted and received waveforms for the WSAM of FIG. 13.
Figure 15:
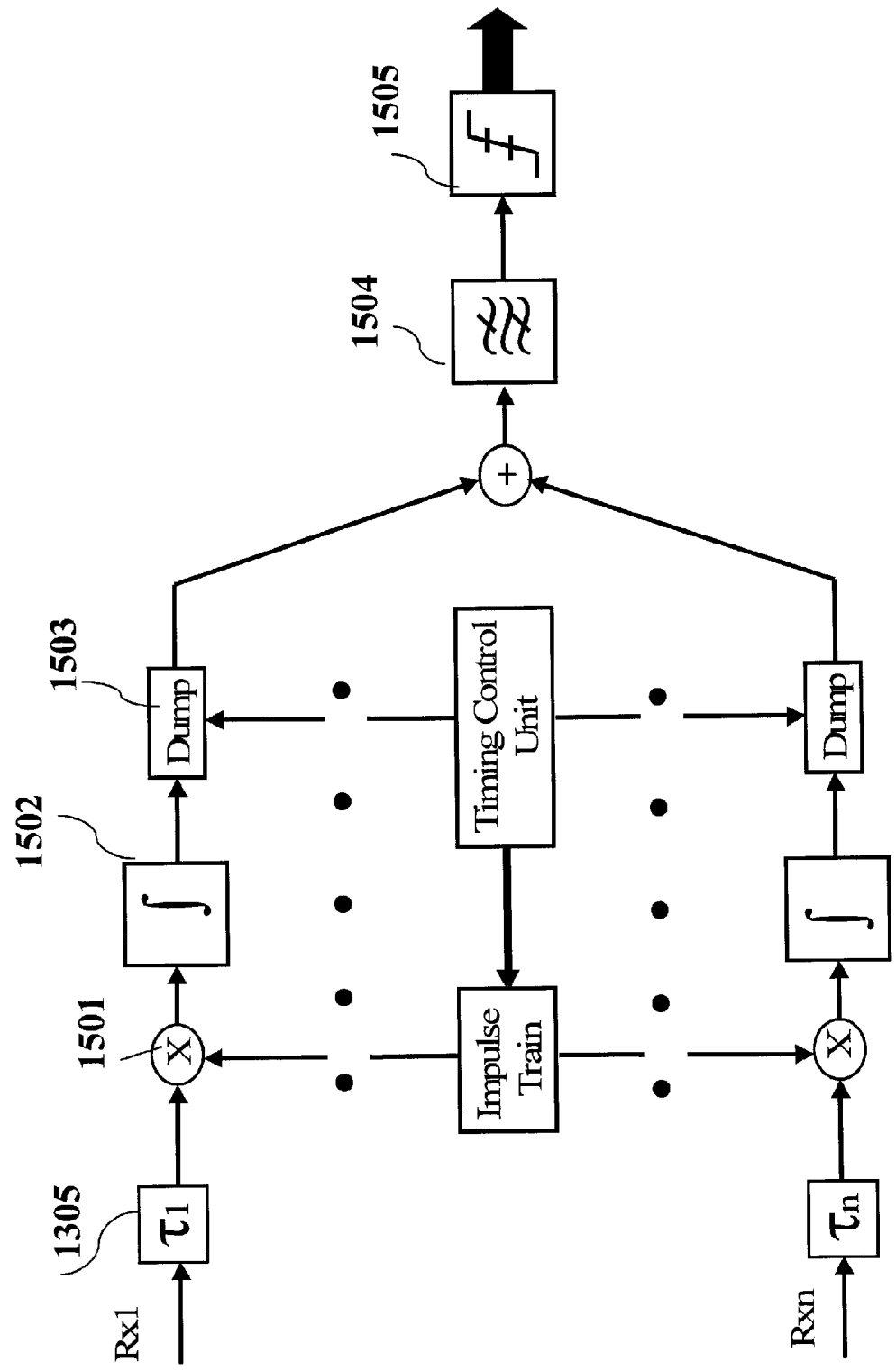
FIG. 15 is a conceptual illustration of the n receiving channels in the WSAM of FIG. 13.

To form the time bins, WSAM has n−1 channels formed from the received RF signal from the antennas. Each channel may include its own low noise amplifier 1304 and delay circuit 1305. Delay circuits 1305 may be constructed using, for example, CPW transmission line segments of the appropriate length to introduce the desired amount of delay. A correlator and integrate and dump circuit 1306 processes the n channels as shown in FIG. 15. Each correlation is performed using, for example, multipliers 1501 such as Gilbert cells. Consider an embodiment having 16 channels: referring to FIG. 14, a first pulse 1 after the transmitted pulse is used in the correlator for channel 1/time bin 1, a second pulse 2 after the transmitted pulse is used in the correlator for channel 2/time bin 2, and so on. Each delay circuit is tuned to delay the corresponding amount of delay. FIG. 14 illustrates how the resulting received and correlated signals are within the noise level and thus undetectable after the first correlation after a transmitted pulse A. However, subsequent correlations and integration in integrators 1502 of FIG. 15 will pull the correlated signal out of the noise as seen after transmitted pulses B and C in FIG. 14. In this fashion, the signal-to-noise in the combined signal after sufficient integrations from dump circuits 1503 will be sufficient for detection of targets. The channels may be combined and processed through a bandpass filter 1504 and analog-to-digital converter 1505.

Referring again to FIG. 1, a receiving CPW network may be formed analogously as shown for network 410. This receiving CPW network may incorporate linear distributed amplification and phase shifting as discussed, for example, in U.S. application Ser. No. 11/535,928. The n channels may then be formed from a received signal at an output port analogous to input port 405. In that regard, the correlation and integration and dump processing may be performed externally to the WSAM or may be integrated with the WSAM. In an alternative embodiment, each integrated antenna circuit may include its own correlation and integration and dump processing circuit such that each integrated antenna circuit includes its own version of the n channels/time bins for processing. Such an embodiment would not have the dispersion introduced by propagation through a CPW receiving network. However, dispersion is not problematic through a receiving network because detection for any given time bin is based upon a peak signal level and thus not that sensitive to spreading of rising and falling times for the received pulses.

Note the advantages of the WSAM embodiment disclosed herein. A integrated (and thus low cost) solution is provided that enables millimeter range resolution and beamforming capabilities. Moreover, because the received signal may be phase shifted so as to have the same received beam direction as for the transmitted pulses, a single antenna array may be used for both transmitting and receiving the beamformed pulses. Although the UWB radars discussed herein have been described with respect to particular embodiments, this description is only an example of certain applications and should not be taken as a limitation. For example, although described with regard to single-ended embodiments, those of ordinary skill will appreciate that equivalent differential embodiments may be constructed according to the principles discussed above. Consequently, the scope of the claimed subject matter is set forth as follows.

I claim:

1. A wafer scale radar antenna module (WSAM), comprising:
   a substrate,
   a plurality of antennas adjacent the substrate;
   an RF feed network adjacent the substrate, the RF feed network coupling to a distributed plurality of amplifiers integrated with the substrate, wherein the RF feed network and the distributed plurality of amplifiers are configured to form a resonant network such that if a timing signal is injected into an input port of the RF feed network, the resonant network oscillates to provide a globally synchronized RF signal to a plurality of integrated antenna circuits, wherein each integrated antenna circuit includes a corresponding subset of antennas from the plurality of antennas, and wherein each integrated antenna circuit includes a pulse shaping circuit having a plurality of selectable delay paths, each pulse shaping circuit being configured to rectify and level shift a version of the globally synchronized signal through selected ones of the selectable delay paths to provide a pulse train output signal; and
   a controller operable to control each integrated antenna circuit such that only selected pulses from the pulse train output signal are transmitted through the integrated antenna circuit's subset of antennas to form transmitted pulses.

2. The WSAM of claim 1, wherein each integrated antenna circuit includes a phase shifter, each phase shifter comprising:
   a plurality of stages, wherein each stage includes:
   a transistor amplifier configured to amplify the globally synchronized signal received at an input node into an amplified voltage signal at an output node according to a gain, wherein the transistor amplifier is configured such that the gain is proportional to a bias signal;
   an integrated inductor loading the output node, wherein the gain of the transistor amplifier is also proportional to an inductance of the integrated inductor; and
   a varactor diode loading the output node, wherein the varactor diode has a variable capacitance responsive to a control voltage such that the version of the globally synchronized signal is produced at the output node.

3. The WSAM of claim 1, wherein the substrate is a semiconductor wafer substrate.

4. The WSAM of claim 1, wherein the RF feed network is implemented using waveguides selected from the group consisting of microstrip waveguides, co-planar waveguides, and planar waveguides.

5. The WSAM of claim 2, wherein the antennas are adjacent a first surface of the substrate and wherein the RF feed network is a co-planar waveguide network adjacent an opposing surface of the substrate, the controller being integrated into the opposing surface.

6. The WSAM of claim 5, wherein the co-planar waveguide network is formed in metal layers adjacent the opposing surface of the substrate.

7. The WSAM of claim 1, further comprising:
   a receiving network adjacent the substrate, the receiving network configured to receive RF signals from the antennas and provide a combined received RF signal, and
   a radar receiver operable to couple the combined received RF signal to n channels, wherein each channel includes a delay line operable to provide a delayed version of the combined RF signal, a multiplier operable to multiply the delayed version with a selected pulse from the pulse train output signal to provide a multiplied signal, and an integrate and dump circuit operable to integrate the multiplied signal over multiple cycles of the transmitted pulses.

8. The WSAM of claim 7, wherein the delay lines are configured such that each channel processes a unique time bin corresponding to the transmitted pulses.

9. A method, comprising:
   driving a resonant network of distributed oscillators to produce an globally synchronized output signal having harmonics;
   processing a selected one of the harmonics to produce a train of pulses; and
   transmitting selected ones of the pulses in the train of pulses;
   receiving returned pulses resulting from reflections of the transmitted pulses;
   delaying the received pulses according to a selected delay;
   multiplying the delayed pulses with another selected one of the pulses in the train of pulses to form a correlated signal; and
   adding the correlated signal over time to form an integrated signal.

10. A wafer scale radar antenna module (WSAM), comprising:
    a substrate,
    a plurality of antennas adjacent a first side of the substrate;
    an RF feed network adjacent a second side of the substrate, the RF feed network coupling to a distributed plurality of amplifiers integrated with the substrate, wherein the RF feed network and the distributed plurality of amplifiers are configured to form a resonant network such that if a timing signal is injected into an input port of the RF feed network, the resonant network oscillates to provide a globally synchronized RF signal to a plurality of integrated antenna circuits, wherein each integrated antenna circuit includes a corresponding subset of antennas from the plurality of antennas, and wherein each integrated antenna circuit includes a pulse shaping circuit having a plurality of selectable delay paths, each pulse shaping circuit being configured to rectify and level shill a version of the globally synchronized signal through selected ones of the selectable delay paths to provide an pulse train output signal;
    a controller operable to control each integrated antenna circuit such that only selected pulses from the pulse train output signal are transmitted through the integrated antenna circuit's subset of antennas to form transmitted pulses; and
    a plurality of receivers corresponding to the plurality of integrated antenna circuits, each receiver being integrated into the substrate and having a plurality of channels, each channel including a delay line configured to delay a received signal from the corresponding integrated antenna circuit, a correlator configured to multiply the delayed received reflected pulses with selected pulses from the pulse train output to form a product output signal, and an integrator operable to add the product output signal over time to form a sum signal.

11. The WSAM of claim 10, wherein each receiver further includes an adder to sum the sum signals from its plurality of channels to form a sum signal, and an analog-to-digital converter operable to digitize the sum signal.

12. The WSAM of claim 10, wherein the substrate is a semiconductor wafer substrate.

13. The WSAM of claim 10, wherein the RF feed network is implemented using waveguides selected from the group consisting of microstrip waveguides, co-planar waveguides, and planar waveguides.

14. The WSAM of claim 13, wherein the RF feed network is implemented using coplanar waveguides.

15. The WSAM of claim 11, wherein the pulses in the pulse train output signal have a pulse width of between 10 and 50 picoseconds.

16. The WSAM of claim 15, wherein the pulses in the pulse train output signal have a pulse width of between 10 and 20 picoseconds.

17. The WSAM of claim 11, further comprising a digital signal processor integrated with the substrate to process the digitized signals.

18. The WSAM of claim 11, wherein the WSAM is configured to provide the digitized signals to an external digital signal processor.

* * * * *